United States Patent
Ikeuchi et al.

(10) Patent No.: US 10,312,428 B2
(45) Date of Patent: Jun. 4, 2019

(54) PIEZOELECTRIC THIN FILM, PIEZOELECTRIC THIN FILM DEVICE, TARGET, AND METHODS FOR MANUFACTURING PIEZOELECTRIC THIN FILM AND PIEZOELECTRIC THIN FILM DEVICE

(71) Applicant: Murata Manufacturing Co., Ltd., Nagaokakyo-shi, Kyoto-fu (JP)

(72) Inventors: Shinsuke Ikeuchi, Nagaokakyo (JP); Toshimaro Yoneda, Nagaokakyo (JP); Yoshitaka Matsuki, Nagaokakyo (JP); Naoyuki Endo, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 447 days.

(21) Appl. No.: 15/245,636

(22) Filed: Aug. 24, 2016

(65) Prior Publication Data

US 2016/0365503 A1     Dec. 15, 2016

Related U.S. Application Data

(63) Continuation of application No. PCT/JP2015/063120, filed on May 1, 2015.

(30) Foreign Application Priority Data

May 19, 2014    (JP) .................................. 2014-103352

(51) Int. Cl.
*H01L 41/187*     (2006.01)
*C23C 14/08*     (2006.01)
(Continued)

(52) U.S. Cl.
CPC ........ *H01L 41/1873* (2013.01); *C04B 35/465* (2013.01); *C04B 35/499* (2013.01);
(Continued)

(58) Field of Classification Search
CPC . H01L 41/187; H01L 41/047; H01L 41/1873; C04B 2235/3201;
(Continued)

(56) References Cited

U.S. PATENT DOCUMENTS 8,450,911 B2    5/2013    Shibata et al.
8,847,470 B2    9/2014    Ikeuchi et al.
(Continued)

FOREIGN PATENT DOCUMENTS

JP    H11228227 A    8/1999
JP    2011109037 A    6/2011
(Continued)

OTHER PUBLICATIONS

Ikeuchi, S. et al.; "Preparation of (K, Na) Nb03—CaTi03 Film by RF Magnetron Sputtering"; 2014 IEEE International Ultrasonics Symposium Proceedings, Sep. 6, 2014, pp. 1578-1581.
(Continued)

*Primary Examiner* — J. San Martin
(74) *Attorney, Agent, or Firm* — Arent Fox LLP

(57) ABSTRACT

A piezoelectric thin film does not easily generate a heterogeneous phase and exhibits good piezoelectric characteristics. The piezoelectric thin film contains a composition represented by a general formula: (1-n) $(K_{1-x}Na_x)_mNbO_3$-$nCaTiO_3$, wherein m, n, and x in the general formula are within the ranges of $0.87 \le m \le 0.97$, $0 \le n \le 0.065$, and $0 \le x \le 1$.

12 Claims, 4 Drawing Sheets

(51) Int. Cl.
*H01L 41/316* (2013.01)
*H01L 41/332* (2013.01)
*C04B 35/465* (2006.01)
*C04B 35/622* (2006.01)
*C23C 14/34* (2006.01)
*C23C 14/35* (2006.01)
*H01J 37/34* (2006.01)
*H01L 41/047* (2006.01)
*H01L 41/09* (2006.01)
*C04B 35/499* (2006.01)

(52) U.S. Cl.
CPC ........ *C04B 35/62222* (2013.01); *C23C 14/08* (2013.01); *C23C 14/3414* (2013.01); *C23C 14/35* (2013.01); *H01J 37/3426* (2013.01); *H01L 41/047* (2013.01); *H01L 41/096* (2013.01); *H01L 41/187* (2013.01); *H01L 41/316* (2013.01); *H01L 41/332* (2013.01); *C04B 2235/3201* (2013.01); *C04B 2235/3208* (2013.01); *C04B 2235/3236* (2013.01); *C04B 2235/3255* (2013.01); *C04B 2235/3262* (2013.01)

(58) Field of Classification Search
CPC .... C04B 2235/3208; C04B 2235/3236; C04B 2235/3255; C04B 2235/3262; C04B 35/465; C04B 35/499; C04B 35/62222; C23C 14/35; C23C 14/3414
See application file for complete search history.

(56) References Cited

U.S. PATENT DOCUMENTS

| | | | |
|---|---|---|---|
| 10,181,554 B2 * | 1/2019 | Ikeuchi | ............... H01L 41/0805 |
| 2011/0121690 A1 | 5/2011 | Shibata et al. | |
| 2013/0106242 A1 | 5/2013 | Shibata | |
| 2013/0127293 A1 | 5/2013 | Ikeuchi et al. | |

FOREIGN PATENT DOCUMENTS

| | | |
|---|---|---|
| JP | 2012019050 A | 1/2012 |
| JP | 2012094613 A | 5/2012 |
| WO | WO 2012020638 A1 | 2/2012 |

OTHER PUBLICATIONS

International Search Report issued for PCT/JP2015/063120, dated Aug. 4, 2015.

Lee, Y. et al.; "Electrical Properties of a 0.95(Na0.5K0.5)NbO3—0.05CaTiO3 Thin Film Grown on a Pt/Ti/SiO2/Si Substrate"; Journal of the American Ceramic Society, vol. 97, Issue 9, Jun. 28, 2014, pp. 2892-2896.

Written Opinion of the International Searching Authority issued for PCT/JP2015/063120, dated Aug. 4, 2015.

* cited by examiner

PIEZOELECTRIC THIN FILM, PIEZOELECTRIC THIN FILM DEVICE, TARGET, AND METHODS FOR MANUFACTURING PIEZOELECTRIC THIN FILM AND PIEZOELECTRIC THIN FILM DEVICE

CROSS REFERENCE TO RELATED APPLICATIONS

The present application is a continuation of International application No. PCT/JP2015/063120, filed May 1, 2015, which claims priority to Japanese Patent Application No. 2014-103352, filed May 19, 2014, the entire contents of each of which are incorporated herein by reference.

TECHNICAL FIELD

The present invention relates to a potassium sodium niobate based piezoelectric thin film, a piezoelectric thin film device that uses the piezoelectric thin film, and a target for forming the piezoelectric thin film. The present invention also relates to methods for manufacturing the piezoelectric thin film and the piezoelectric thin film device.

BACKGROUND ART

Much focus has been placed on piezoelectric materials composed of potassium sodium niobate having a perovskite crystal structure as lead-free piezoelectric ceramic compositions.

Japanese Unexamined Patent Application Publication No. 11-228227 discloses a piezoelectric ceramic composition containing a composition represented by a general formula: $(1-n) (K_{1-x-y}Na_xLi_y)_m(Nb_{1-z}Ta_z)O_3\text{-}nM1M2O_3$ as a primary component wherein m, n, x, y, and z fall within the ranges $0.98 \leq m \leq 1.0$, $0 < n < 0.1$, $0.1 \leq x$, $y \leq 0.3$, $x+y < 0.75$, and $0 \leq z \leq 0.3$.

SUMMARY OF INVENTION

Technical Problem

Piezoelectric devices exhibiting good piezoelectric characteristics can be obtained by using the piezoelectric ceramic composition described in Japanese Unexamined Patent Application Publication No. 11-228227. However, in the case where the above-described piezoelectric ceramic composition is made into a thin film, a heterogeneous phase having a structure other than the perovskite structure may undesirably be generated. Also, when thin films are made, the piezoelectric characteristics are still sometimes insufficient.

It is an object of the present invention to provide a piezoelectric thin film in which a heterogeneous phase is not easily generated and which exhibits good piezoelectric characteristics, a piezoelectric thin film device including the foregoing piezoelectric thin film, and a target for forming the foregoing piezoelectric thin film. It is another object of the present invention to provide methods for manufacturing the foregoing piezoelectric thin film and a piezoelectric thin film device using the foregoing piezoelectric thin film.

Solution to Problem

The present inventors have discovered that these objects can be attained by limiting the ranges of m, n and x in a composition represented by a general formula: $(1-n) (K_{1-x}Na_x)_mNbO_3\text{-}nCaTiO_3$, to within the ranges of $0.87 \leq m \leq 0.97$, $0 \leq n \leq 0.065$, and $0 \leq x \leq 1$.

x is preferably within the range of $0.52 \leq x \leq 1$, more preferably within the range of $0.52 \leq x \leq 0.74$ and even more preferably within the range of $0.61 \leq x \leq 0.74$.

In the piezoelectric thin film according to the present invention, n is preferably within the range of $0.005 \leq n \leq 0.065$ and more preferably within the range of $0.011 \leq n \leq 0.059$. Various advantages of maintaining these variables within the noted ranges are set forth below.

The piezoelectric thin film according to the present invention also preferably contains Mn. The content of Mn is preferably more than 0.1 mol and 10 mol or less relative to 100 mol of the composition represented by the general formula: $(1-n) (K_{1-x}Na_x)_mNbO_3\text{-}nCaTiO_3$.

A piezoelectric thin film device according to the present invention includes a substrate, a piezoelectric thin film disposed on the substrate and first and second electrodes disposed so as have the piezoelectric thin film interposed therebetween.

A target according to the present invention contains a composition represented by a general formula: $(1-n) (K_{1-x}Na_x)_mNbO_3\text{-}nCaTiO_3$, wherein m, n, and x in the general formula are within the ranges of $1 \leq m \leq 1.05$, $0 \leq n \leq 0.065$, and $0 \leq x \leq 1$. More preferably, n and x in the general formula are within the ranges of $0.005 \leq n \leq 0.065$ and $0.43 \leq x \leq 0.74$. Even more preferably, n and x in the general formula are within the ranges of $0.011 \leq n \leq 0.059$ and $0.52 \leq x \leq 0.74$.

A method for manufacturing a piezoelectric thin film, according to the present invention, includes the step of forming the piezoelectric thin film by sputtering using the foregoing target.

A method for manufacturing a piezoelectric thin film device according to the present invention includes the steps of obtaining a piezoelectric thin film by performing sputtering that uses the foregoing target, forming a first electrode on the piezoelectric thin film, and forming a second electrode so as to interpose the piezoelectric thin film between the first electrode and the second electrode.

Preferably, the method for manufacturing a piezoelectric thin film device according to the present invention further includes the steps of forming a mask layer on the piezoelectric thin film using a resin resist and dry-etching the piezoelectric thin film in the presence of the mask layer.

In the method for manufacturing a piezoelectric thin film device according to the present invention preferably, sputtering is performed using both the foregoing target and a target containing Mn so as to obtain a piezoelectric thin film. As a result, in the method for manufacturing a piezoelectric thin film device according to the present invention, the target preferably also contains Mn.

Advantageous Effects of Invention

According to the present invention, a piezoelectric thin film, in which a heterogeneous phase is not easily generated and which exhibits good piezoelectric characteristics, can be provided.

DESCRIPTION OF EMBODIMENTS

Specific embodiments according to the present invention will be described below with reference to the drawings so as to make the present invention clear.

(Piezoelectric Thin Film Device)

Figure 1:
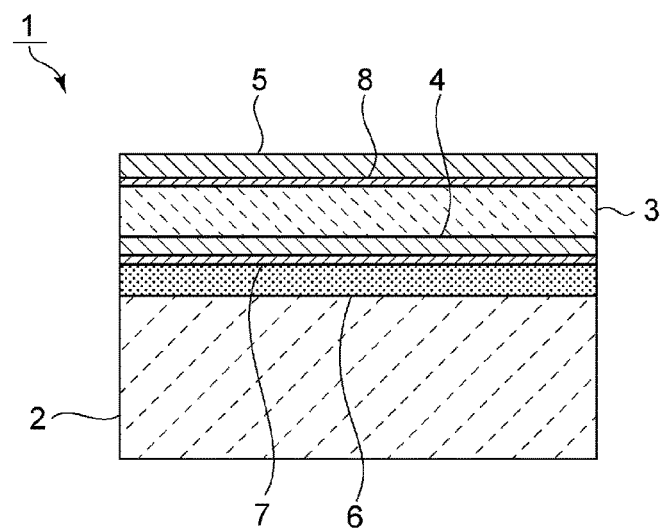
FIG. 1 is a schematic elevational cross-sectional view of a piezoelectric thin film device according to an embodiment of the present invention.

FIG. 1 is a schematic elevational cross-sectional view of a piezoelectric thin film device according to an embodiment of the present invention. The piezoelectric thin film device 1 includes a substrate 2 which is preferably composed of Si. The substrate 2 may be composed of glass, SOI, other semiconductor materials or single crystal materials, or metal materials, e.g., stainless steel or titanium.

An $SiO_2$ film 6 is preferably disposed on the substrate 2 and electrically insulates a first electrode 4 disposed on the $SiO_2$ film 6 from the substrate 2. However, the $SiO_2$ film 6 may be omitted.

The first electrode 4 is preferably adhered to the $SiO_2$ film 6 using a first Ti adhesion layer 7 (e.g., $TiO_x$). It is desirable that the first electrode 4 be composed of a material which is stable even in a high-temperature oxygen atmosphere. Examples of such a material include noble metal materials, e.g., Pt, Au, and Ir, and electrically conductive oxide materials. In the present embodiment, the first electrode 4 is composed of Pt.

A piezoelectric thin film 3 is stacked on the first electrode 4. The piezoelectric thin film 3 contains a composition represented by a general formula: (1-n) $(K_{1-x}Na_x)_m NbO_3$-$nCaTiO_3$.

A second electrode 5 is adhered to the piezoelectric thin film 3 by a second adhesion layer 8. The second electrode 5 is preferably composed of Pt but may be composed of another appropriate electrically conductive material. The second adhesion layer 8 is preferably composed of a Ti material, for example $TiO_x$.

The first and second adhesion layers may be omitted and the piezoelectric thin film 3 may be interposed directly between the first and second electrodes.

(Piezoelectric Thin Film)

As described above, the piezoelectric thin film according to the present invention contains the composition (KNN-CT) represented by the general formula: (1-n) $(K_{1-x}Na_x)_m NbO_3$-$nCaTiO_3$. In the general formula, m, n, and x are preferably within the ranges of $0.87 \leq m \leq 0.97$, $0 \leq n \leq 0.065$, and $0 \leq x \leq 1$. The advantages of these ranges are discussed below.

When m is less than 0.87, a heterogeneous phase having a non-perovskite structure of the KNN-CT is generated in a large amount. The piezoelectric thin film is formed by a sputtering method, as described below. Therefore, A-site cations, e.g., K and Na, are easily lost during film formation. Consequently, where m, that is, (K+Na)/Nb, is small, the amount of A-site cations (e.g., K and Na) becomes insufficient and the heterogeneous phase having a structure non-perovskite structure is generated.

On the other hand, in the case where m is more than 0.97, it is difficult to produce the piezoelectric thin film containing KNN-CT by sputtering. Therefore, the value of m in the general formula in the present invention is specified as $0.87 \leq m \leq 0.97$.

Also, where the value of n is within the above-described range, good piezoelectric characteristics can be obtained. This is believed to be based on the following mechanism.

Initially, in the bulk KNN-CT, phase transition of the crystal structure from an orthorhombic structure to tetragonal structure occurs in the range of $0.04 \leq n \leq 0.06$. Consequently, in the vicinity of the range of $0.04 \leq n \leq 0.06$, the crystal structure is highly unstable and the piezoelectric characteristics are enhanced. If n is increased further, the piezoelectric characteristics are enhanced up to the range of $n \leq 0.1$. In contrast, the piezoelectric characteristics are degraded in the range of $n > 0.1$. The reason is believed to be that $CaTiO_3$, which has not completely dissolved into the crystal as a solid solution, precipitates so as to adversely affect the piezoelectric characteristics.

Here, the piezoelectric thin film characteristically exhibits internal stress, crystal defects, and the like. Therefore, the range of n in which the above-described phase transition occurs shifts to a lower side compared with the KNN-CT bulk. Consequently, good piezoelectric characteristics of the piezoelectric thin film are obtained in the range of $0 \leq n \leq 0.065$.

The ranges of m, n, and x of the composition represented by the general formula according to the present invention will be described below more specifically with reference to FIG. 2 to FIG. 5. In this regard, m, n, and x were calculated by using the following formulae (1) to (3), where the contents (mol) of K, Na, Nb, and Ca were measured by quantitative analysis based on Inductive Coupled Plasma Mass spectrometry (ICP-MS).

$m = (K+Na)/Nb$     Formula (1)

$n = Ca/Nb$     Formula (2)

$x = Na/(K+Na)$     Formula (3)

Figure 2:
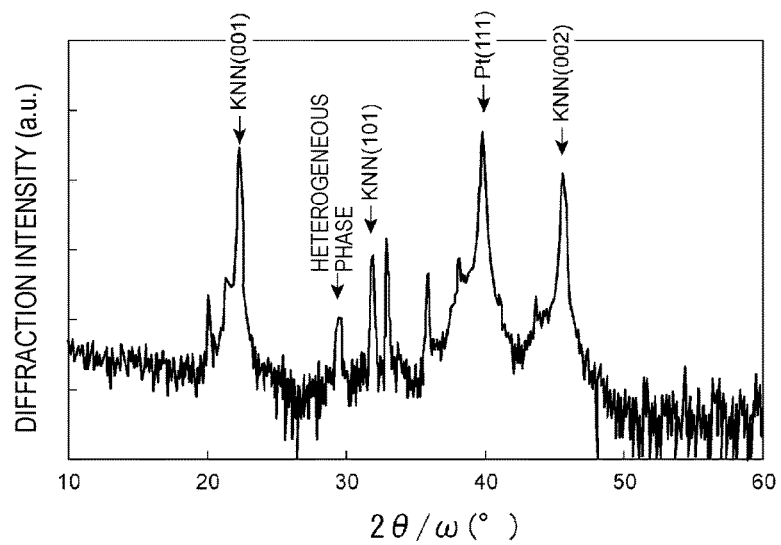
FIG. 2 is a diagram showing an XRD spectrum of a piezoelectric thin film according to an embodiment of the present invention.

FIG. 2 is a diagram showing an x-ray diffraction (XRD) spectrum of a piezoelectric thin film according to an embodiment of the present invention. The XRD spectrum was measured by an out-of-plane 2θ/ω scan that used CuKα line (λ=0.154056 nm). Also, in FIG. 2, the Miller indices of the piezoelectric thin film are expressed under the assumption that the crystal structure is pseudo-cubic.

As is clear from FIG. 2, a peak resulting from a heterogeneous phase is present at 2θ/ω=about 28° to 30° in addition to a peak resulting from the perovskite structure of KNN-CT.

Figure 3:
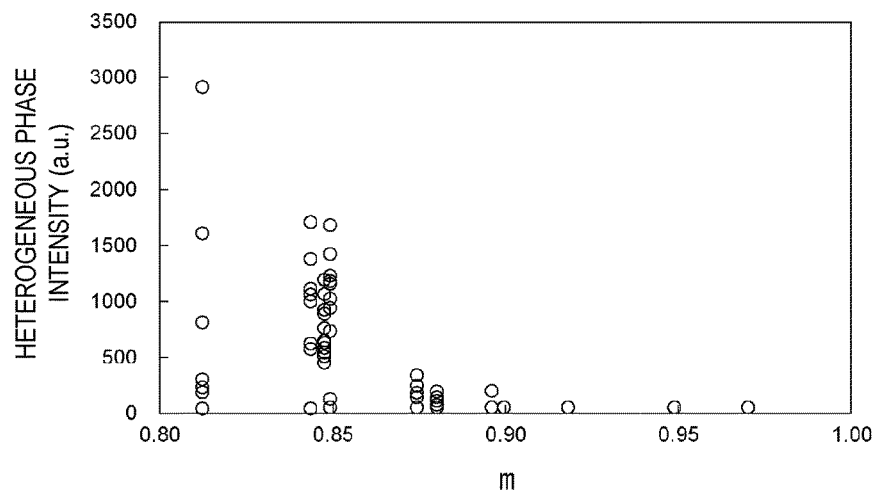
FIG. 3 is a diagram showing the relationship between the value of m in the general formula: (1-n) $(K_{1-x}Na_x)_m NbO_3$-$nCaTiO_3$ and the peak intensity of a heterogeneous phase in the XRD spectrum shown in FIG. 2.

FIG. 3 is a diagram showing the relationship between the value of m in the general formula: (1-n) $(K_{1-x}Na_x)_m NbO_3$-$nCaTiO_3$ and the peak intensity of the heterogeneous phase in the XRD spectrum shown in FIG. 2. As is clear from FIG. 3, the peak intensity of the heterogeneous phase is reduced when the value of m is within the range of $0.087 \leq m \leq 0.97$.

Figure 4:
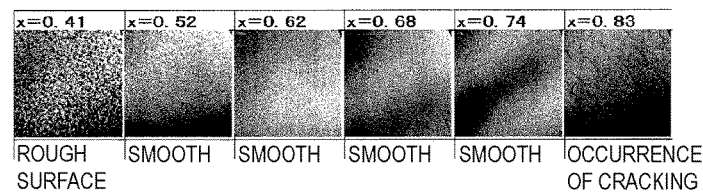
FIG. 4 is a diagram showing the surface state of a piezoelectric thin film, where the value of x in the general formula: (1-n) $(K_{1-x}Na_x)_m NbO_3$-$nCaTiO_3$ was changed from 0.41 to 0.83 in the piezoelectric thin film according to an embodiment of the present invention.

FIG. 4 is a diagram showing the surface state of a piezoelectric thin film, where the value of x in the general formula: (1-n) $(K_{1-x}Na_x)_m NbO_3$-$nCaTiO_3$ was changed from 0.41 to 0.83 in the piezoelectric thin film according to an embodiment of the present invention. The observation of the surface state shown in FIG. 4 was performed by observing a field of view about 125 μm square by using a laser microscope.

As is clear from FIG. 4, when the value of x is within the range of $0.52 \leq x \leq 0.74$, the surface of the piezoelectric thin film is smoother.

If the value of x is too small, that is, if the proportion of K in the Na/(K+Na) is too large, it is believed that the surface of the piezoelectric thin film easily becomes rough because the range of the optimum condition for film formation by sputtering is narrowed.

On the other hand, it is believed that if the value of x is too large, the internal stress of the piezoelectric thin film acts as strong tensile stress and, as a result, surface cracking easily occurs.

Figure 5:
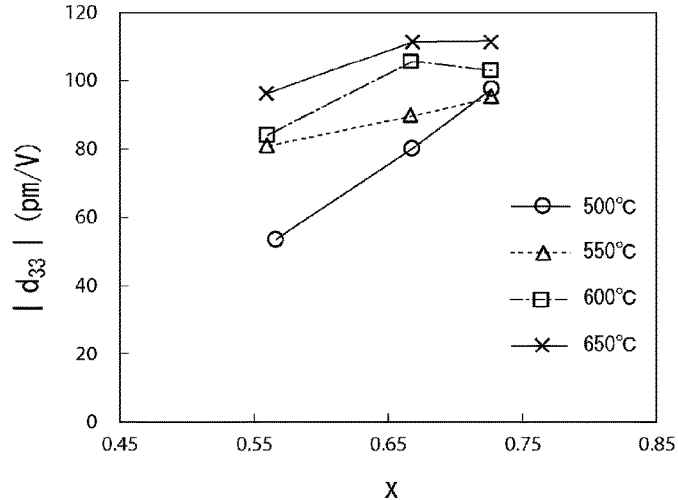
FIG. 5 is a diagram showing the relationship between the value of x in the general formula: (1-n) $(K_{1-x}Na_x)_m NbO_3$-$nCaTiO_3$ and the piezoelectric constant $|d_{33}|$, where the film formation temperature of the piezoelectric thin film was changed in the range of 500° C. to 650° C.

FIG. 5 is a diagram showing the relationship between the value of x in the general formula: (1-n) $(K_{1-x}Na_x)_m NbO_3$-$nCaTiO_3$ and the piezoelectric constant $|d_{33}|$, where the film formation temperature of the piezoelectric thin film was varied in the range of 500° C. to 650° C.

In this regard, a piezoelectric thin film device having the same structure as the structure of the above-described piezoelectric thin film device 1 according to an embodiment of the present invention was produced, and the piezoelectric constant $|d_{33}|$ was measured using a Double Beam Laser Interferometer (DBLI) apparatus (produced by aixACCT). To this end, an electric field was applied in the thickness direction of the piezoelectric thin film 3 by providing a potential difference between the first electrode 4 and the second electrode 5, and the displacement in the thickness direction due to the electric field induced strain was measured so as to determine the piezoelectric constant $|d_{33}|$.

In these measurements, the second electrode 5 was used as a ground electrode, a positive voltage was applied to the first electrode 4, and the electric field applied to the piezoelectric thin film 3 was adjusted to 90 kV/cm. All the films were prepared at a plurality of film-forming temperatures. The films of each temperature with small amounts of heterogeneous phase relative to the perovskite structure have different x of the composition of (1-n) $(K_{1-x}Na_x)_m NbO_3$-$nCaTiO_3$.

As is clear from FIG. 5, the piezoelectric constant $|d_{33}|$ increased in the range of $0.55 \leq x \leq 0.74$. Also, it is clear that as the film formation temperature became high, the piezoelectric constant $|d_{33}|$ increased more effectively. Specifically, it is clear that regarding the samples at 550° C. or higher, $|d_{33}| \geq 63$ (pm/V) was held in the range of $0.55 \leq x \leq 0.74$ and, therefore, the piezoelectric constant $|d_{33}|$ increased.

Here, it was ascertained that the sample exhibiting $|d_{33}| \geq 63$ (pm/V) satisfied the condition $|d_{31}| \geq 50$ (pm/V). Also, in general, it is known that a piezoelectric thin film exhibiting $|d_{31}| \geq 50$ (pm/V) is suitable for use as an actuator-related device. Therefore, in the case where the film formation temperature is 550° C. or higher, it is preferable that x be within the range of $0.55 \leq x \leq 0.74$.

On the other hand, as is clear from FIG. 5, when the film formation temperature was 500° C., the condition $|d_{33}| \geq 63$ (pm/V) was satisfied in the range of $0.61 \leq x \leq 0.74$ and, therefore, the piezoelectric constant $|d_{33}|$ increased all the more effectively.

In general, in the case where the piezoelectric thin film is formed, if the film formation temperature is too high, problems may occur in that, for example, a close contact force of the adhesion layer is degraded because of diffusion and a lead time of the film formation process increases. On the other hand, if the film formation temperature is lower than 500° C., the perovskite crystal does not easily grow. Therefore, the film formation temperature is set at preferably 500° C.

Consequently, the value of x in the above-described general formula can satisfy the condition $|d_{33}| \geq 63$ (pm/V) when the film formation temperature is set at 500° C. The range of $0.61 \leq x \leq 0.74$ is more preferable.

Figure 6:
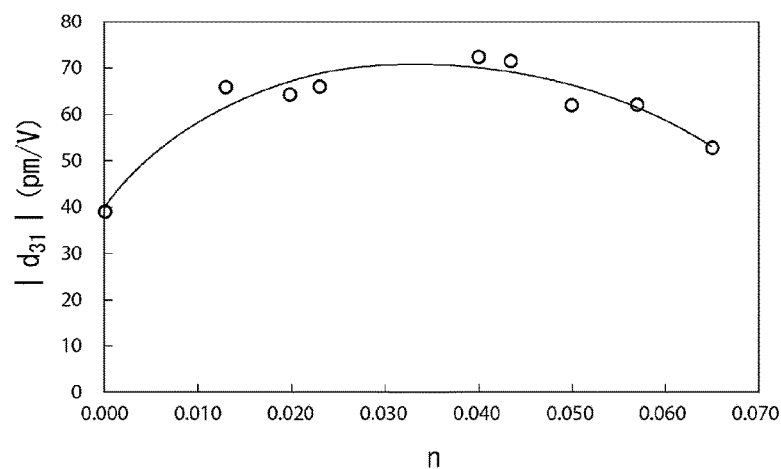
FIG. 6 is a diagram showing the relationship between the value of n in the general formula: (1-n) $(K_{1-x}Na_x)_m$—$NbO_3$-$nCaTiO_3$ and the piezoelectric constant $|d_{31}|$.

FIG. 6 is a diagram showing the relationship between the value of n in the general formula: (1-n) $(K_{1-x}Na_x)_m NbO_3$-$nCaTiO_3$ and the piezoelectric constant $|d_{31}|$.

A piezoelectric thin film device having the same structure as the structure of the above-described piezoelectric thin film device 1 according to an embodiment of the present invention was used to measure the piezoelectric constant $|d_{31}|$. Also, in order to measure the piezoelectric characteristics, an open-sided unimorph cantilever including the piezoelectric thin film 3 and the substrate 2 was produced.

Subsequently, the second electrode 5 was used as a ground electrode, a positive voltage was applied to the first electrode 4, an electric field applied to the piezoelectric thin film 3 was adjusted to 90 kV/cm. The piezoelectric constant $|d_{31}|$ was then calculated from the displacement of the end of the unimorph cantilever due to the application of the voltage. The method for measuring the piezoelectric constant $|d_{31}|$ in the present experimental example is the same as the method described in Japanese Unexamined Patent Application Publication No. 2012-019050. When the piezoelectric constant $|d_{31}|$ was calculated, the value of the Young's modulus of the piezoelectric thin film 3 was the same as the value of the bulk KNN-CT. The film formation conditions, except for the value of n in the samples, were substantially the same, and the absolute amounts of heterogeneous phase were small relative to the perovskite structure.

As is clear from FIG. 6, the piezoelectric constant $|d_{31}|$ increases in the case where n in the above-described general formula is within the range of $0 \leq n \leq 0.65$. Also, it is clear that the relationship of $|d_{31}| \geq 50$ (pm/V) is satisfied in the case where n is within the range of $0.005 \leq n \leq 0.065$. The case where the piezoelectric constant $d_{31}$ is 50 (pm/V) is suitable for use as an actuator-related device. Therefore, it is preferable that n in the above-described general formula be within the range of $0.005 \leq n \leq 0.065$.

Further, it is clear that in the case where n is within the range of $0.011 \leq n \leq 0.059$, the relationship of $|d_{31}| \geq 60$ (pm/V) is satisfied and, therefore, the piezoelectric constant $|d_{31}|$ increases all the more effectively. As a result, it is more preferable that n be within the range of $0.011 \leq n \leq 0.059$.

As described above, when the value of m in the composition represented by the general formula: (1-n) $(K_{1-x}Na_x)_m NbO_3$-$nCaTiO_3$ is within the range of $0.87 \leq m \leq 0.97$, generation of a heterogeneous phase having a non-perovskite structure is suppressed.

Also, in the case where the value of x in the above-described general formula is within the range of $0.52 \leq x$, the surface of the piezoelectric thin film can be made smoother.

In the case where the value of x is within the range of $x \leq 0.74$, an occurrence of surface cracking of the piezoelectric thin film can be effectively suppressed. In addition, in the case where the value of x is within the range of $0.61 \leq x \leq 0.74$, the piezoelectric characteristics of the piezoelectric thin film can be enhanced even more effectively.

Therefore, the value of x is preferably $0.52 \leq x \leq 1$, more preferably $0.52 \leq x \leq 0.74$, and even more preferably within the range of $0.61 \leq x \leq 0.74$.

In the case where the value of n in the above-described general formula is within the range of $0 \leq n \leq 0.065$, good piezoelectric characteristics can be obtained. The value of n is preferably within the range of $0.005 \leq n \leq 0.065$, and more preferably within the range of $0.011 \leq n \leq 0.059$. When the value of n is within the above-described range, the piezoelectric characteristics of the piezoelectric thin film are further enhanced.

(Target)

According to the present invention, the piezoelectric thin film 3 is preferably produced using a target containing a composition represented by a general formula: $(1-n) (K_{1-x}Na_x)_m NbO_3 - nCaTiO_3$. M, n, and x are preferably within the ranges of $1 \leq m \leq 1.05$, $0 \leq n \leq 0.065$, and $0 \leq x \leq 1$.

As described below, the piezoelectric thin film is produced by performing sputtering that uses the above-described target. It is known that if production is performed by such a method, the amount of loss of K is not more than 30% during formation of the piezoelectric thin film. The composition of the resulting piezoelectric thin film deviates from the target composition by the amount of loss of K.

For example, in the case where a target, in which the value of x is 0.33 and (K+Na)/Nb, that is, the value of m, is 1, is used, the value of m of the resulting piezoelectric thin film becomes m=0.80 when the amount of loss of K is 30%. When using a target whose value x is 0.77 and value m is 1, m=0.93 is obtained. That is, when using a target whose value x is $0.33 \leq x \leq 0.77$ and whose value m is 1, the value of m of the resulting piezoelectric thin film is $0.80 \leq m \leq 0.93$. In order to make the value of m greater than 0.93, the value of m of the target has to be m>1. However, when the value of m of the target is greater than 1.05, that is, if the amount of K is excessively increased, K in excess of limitation of solid solution precipitates at grain boundaries. In this case, the shape stability of the target is lost because of the deliquescence of K. Therefore, the value of m of the target is preferably $1 \leq m \leq 1.05$.

As a result, where the value of m in the target is $1 \leq m \leq 1.05$ and the value of x in the target is $0.33 \leq x \leq 0.77$, the value of m of the resulting piezoelectric thin film 3 (caused by sputtering the target) becomes $0.80 \leq m \leq 0.97$. Therefore, even under the film formation condition in which the amount of loss of K is 30%, the piezoelectric thin film exhibiting the value of m of $0.87 \leq m \leq 0.97$, can be produced by using a target exhibiting the value of m of $1 \leq m \leq 1.05$.

Likewise, for example, in the case where the production of a piezoelectric thin film exhibiting the value of x of $0.52 \leq x \leq 0.74$ is intended, the value of x of the target has to be $0.43 \leq x \leq 0.74$ when the amount of loss of K is 30%. In the case where the production of a piezoelectric thin film exhibiting the value of x of $0.61 \leq x \leq 0.74$ is intended, the value of x of the target has to be $0.52 \leq x \leq 0.74$.

In contrast, n is not affected by the amount of loss of K. As a result, the composition of the piezoelectric thin film does not deviate from the composition of the target. Therefore, the predetermined value of n of the piezoelectric thin film can be applied to the composition of the target without being changed.

For example, in the case where the production of a piezoelectric thin film exhibiting the value of n of $0.005 \leq n \leq 0.065$ is intended, the value of n of the target has to be $0.005 \leq n \leq 0.065$. In the case where the production of a piezoelectric thin film exhibiting the value of n of $0.011 \leq n \leq 0.059$ is intended, the value of n of the target has to be $0.011 \leq n \leq 0.059$.

(Manufacturing Method)

In a method for manufacturing the piezoelectric thin film device 1, the $SiO_2$ film 6 is formed on the substrate 2. Thereafter, the first adhesion layer 7 and the first electrode 4 are stacked on the $SiO_2$ film 6 in that order.

Subsequently, the piezoelectric thin film 3 is formed on the first adhesion layer 7 by sputtering. A buffer layer for controlling the orientation and the stress may be disposed between the first electrode 4 and the piezoelectric thin film 3. Examples of materials for forming the buffer layer include perovskite oxide materials, e.g., $LaNiO_3$ and $SrRuO_3$, and potassium sodium niobate (KNN) based thin films formed at low temperatures.

The sputtering can be performed by, for example, RF magnetron sputtering preferably using the above-described target.

There is no particular limitation regarding the conditions under which the above-described sputtering is performed as long as the resulting piezoelectric thin film 3 has the perovskite structure. Exemplary conditions are described below.

The substrate heating temperature is set at between 500° C. to 650° C. in terms of apparatus set temperature. The sputtering is performed in an atmosphere of a mixed gas of Ar and $O_2$, and the ratio $O_2/(Ar+O_2)$ related to Ar and $O_2$ is adjusted to about 1 to 10%. The pressure of the sputtering is set at 0.3 Pa. In addition, the cathode power per unit area is set at 2.5 W/cm2 and the film formation time is adjusted such that the film thickness of the resulting piezoelectric thin film 3 is 1 to 3 µm.

The piezoelectric thin film 3 may further contain Mn. The piezoelectric thin film 3 containing Mn can be formed by performing sputtering that uses the above-described target, further containing Mn. Alternatively, formation can be performed by performing sputtering that uses another target containing Mn in addition to the above-described target according to the present invention.

As described above, in the case where the film formation is performed by further adding Mn, the leakage characteristics of the resulting piezoelectric thin film 3 can be improved. However, if too much Mn is added, the perovskite structure may collapse.

Therefore, the content of Mn in the piezoelectric thin film 3 is preferably more than 0.1 mol and less than or equal to 10 mol, more preferably more than 0.1 mol and less than or equal to 5 mol, and further preferably 1 mol or more and less than or equal to 2 mol relative to 100 mol of KNN-CT.

Finally, the piezoelectric thin film device 1 can be obtained by forming the second adhesion layer 8 and the second electrode 5 on the piezoelectric thin film 3 in that order. The piezoelectric thin film 3 may be subjected to a post annealing step that is, an additional heating step at a predetermined temperature, before the second electrode 5 is formed or after the second electrode 5 is formed.

Usually, the resulting piezoelectric thin film device 1 is patterned by dry etching. In the case where the piezoelectric thin film 3 contains Mn, as described above, degradation of the insulation characteristics after dry etching is suppressed. This will be described below in more detail with reference to specific experimental examples.

Specifically, first, a piezoelectric thin film device was produced following the above-described method for manufacturing the piezoelectric thin film device 1, wherein the values of x and n of KNN-CT in the piezoelectric thin film were x=0.65 and n=0.023, respectively, and 2 mol of Mn was added relative to 100 mol of KNN-CT.

Thereafter, the piezoelectric thin film device obtained by using ICP-RIE System (Model "RIE-10iP" produced by Samco Inc.) was subjected to micromachining through dry etching. A mixed gas of Ar and $CHF_3$ was used as a reactive gas when performing micromachining. A fluorine based reactive gas, e.g., $C_4H_8$, or a chlorine gas may be used instead of $CHF_3$. In the present experimental example, an additional heating step was not performed.

Subsequently, an electric field was applied to the piezoelectric thin film in the thickness direction so as to examine the ferroelectric characteristics by applying a potential difference between the first electrode and the second electrode of the piezoelectric thin film device subjected to the micromachining. Specifically, the magnitude of the electric field was changed and, at that time, changes in the polarization characteristics were examined.

Figure 7:
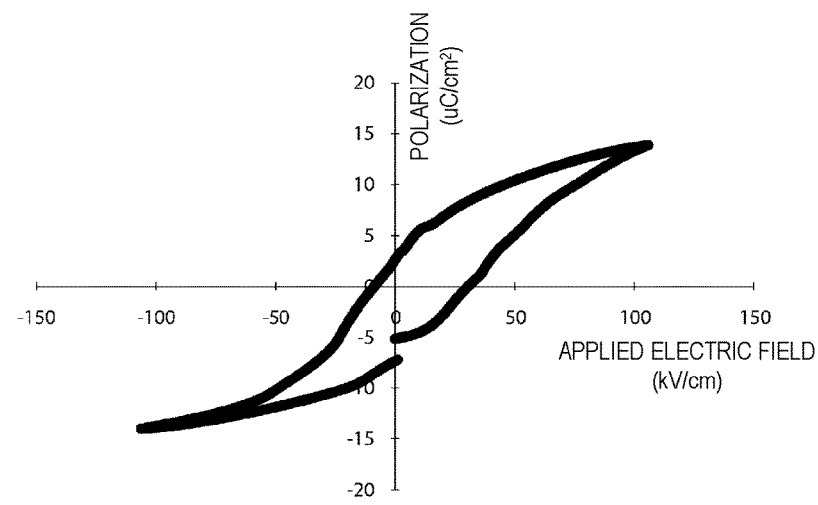
FIG. 7 is a diagram showing the P-E hysteresis of a piezoelectric thin film device sample subjected to micromachining.
Figure 8:
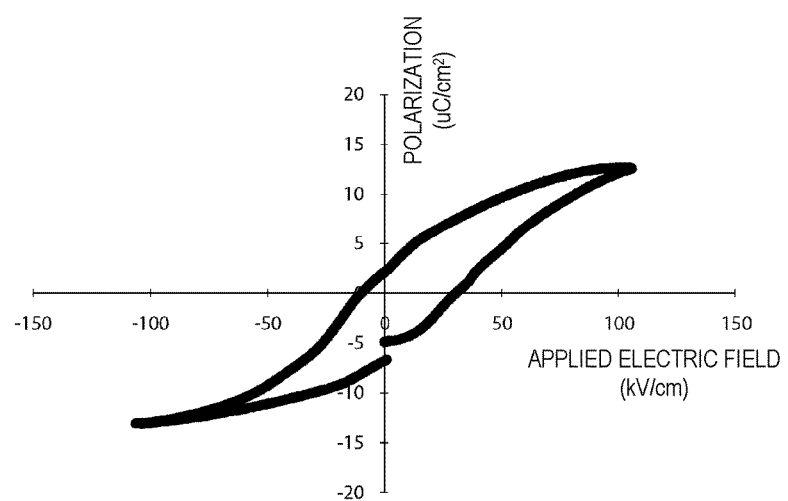
FIG. 8 is a diagram showing the P-E hysteresis of a piezoelectric thin film device sample before being subjected to micromachining.

FIG. 7 is a diagram showing the P-E hysteresis of the piezoelectric thin film device sample subjected to the micromachining. FIG. 8 is a diagram showing the P-E hysteresis of the piezoelectric thin film device sample before being subjected to the micromachining.

It was ascertained from FIG. 7 and FIG. 8 that the ferroelectric characteristics of the piezoelectric thin film device sample before being subjected to the micromachining were maintained with respect to the piezoelectric thin film device sample after being subjected to the micromachining.

Meanwhile, Table 1 below shows leakage currents before and after the micromachining, where x, n, the amount of addition of Mn, and the preheating condition before micromachining of the piezoelectric thin film device in the above-described experimental example were changed. It is ascertained from Table 1 that degradation of the leakage characteristics, that is, degradation of the insulation characteristics, was suppressed under every condition.

tive can be used. In the preferred embodiment, Product number "AZP4903" produced by AZ Electronic Materials was used.

In the case where dry etching is performed using the above-described resin resist, degradation of the insulation characteristics due to the dry etching can be suppressed. A piezoelectric thin film device exhibiting good piezoelectric characteristics can be obtained without performing an additional heating step.

The invention claimed is:

1. A piezoelectric thin film comprising a composition represented by a general formula: (1-n) $(K_{1-x}Na_x)_mNbO_3$-$nCaTiO_3$, wherein m, n, and x are within the ranges of $0.87 \le m \le 0.97$, $0 \le n \le 0.065$, and $0 \le x \le 1$.

2. The piezoelectric thin film according to claim 1, wherein x is within the range of $0.52 \le x \le 1$.

3. The piezoelectric thin film according to claim 1, wherein x is within the range of $0.52 \le x \le 0.74$.

4. The piezoelectric thin film according to claim 1, wherein x is within the range of $0.61 \le x \le 0.74$.

5. The piezoelectric thin film according to claim 1, wherein n is within the range of $0.005 \le n \le 0.065$.

6. The piezoelectric thin film according to claim 1, wherein n is within the range of $0.011 \le n \le 0.059$.

7. The piezoelectric thin film according to claim 1, wherein the piezoelectric thin film further comprises Mn.

8. The piezoelectric thin film according to claim 7, wherein the content of Mn is more than 0.1 mol and no more than 10 mol relative to 100 mol of the composition represented by the general formula: (1-n) $(K_{1-x}Na_x)_mNbO_3$-$nCaTiO_3$.

9. A piezoelectric thin film device comprising:
a substrate;
the piezoelectric thin film of claim 1 disposed on the substrate; and
first and second electrodes disposed so as have the piezoelectric thin film interposed therebetween.

TABLE 1

| | x | n | Amount of addition of Mn (mol) | Preheating before micromachining | Leakage current before micromachining (A/cm$^2$) | Leakage current after micromachining (A/cm$^2$) |
|---|---|---|---|---|---|---|
| Level 1 | 0.65 | 0.023 | 2 | yes | 6.61E−05 | 2.37E−05 |
| Level 2 | 0.65 | 0.023 | 2 | yes | 1.85E−05 | 1.65E−05 |
| Level 3 | 0.65 | 0.023 | 2 | yes | 5.82E−06 | 2.25E−06 |
| Level 4 | 0.65 | 0.023 | 2 | none | 4.10E−07 | 3.72E−07 |
| Level 5 | 0.65 | 0.023 | 2 | none | 1.85E−07 | 1.52E−07 |
| Level 6 | 0.65 | 0.023 | 2 | none | 3.40E−07 | 3.55E−07 |
| Level 7 | 0.65 | 0.023 | 2 | none | 3.12E−07 | 2.42E−07 |
| Level 8 | 0.73 | 0.02 | 1 | none | 1.15E−07 | 9.43E−08 |
| Level 9 | 0.73 | 0.02 | 1 | none | 1.35E−07 | 1.04E−07 |
| Level 10 | 0.73 | 0.02 | 1 | none | 1.25E−07 | 1.19E−07 |
| Level 11 | 0.73 | 0.02 | 1 | none | 1.34E−07 | 1.10E−07 |

The piezoelectric thin film device may be patterned by performing dry etching that uses a resin resist. That is, the steps of forming a mask layer on the piezoelectric thin film using the resin resist and dry-etching the piezoelectric thin film using the mask layer may be further included.

Regarding the material used as the resin resist, a material containing propylene glycol monomethyl acetate as a primary component and containing predetermined amounts of novolac resin derivative and naphthoquinone diazide deriva- 10. A target comprising a composition represented by a general formula: (1-n) $(K_{1-x}Na_x)_mNbO_3$-$nCaTiO_3$, wherein m, n, and x are within the ranges of $1 \le m \le 1.05$, $0 \le n \le 0.065$, and $0 \le x \le 1$.

11. The target according to claim 10, wherein n and x are within the ranges of $0.005 \le n \le 0.065$ and $0.43 \le x \le 0.74$.

12. The target according to claim 10, wherein n and x are within the ranges of $0.011 \le n \le 0.059$ and $0.52 \le x \le 0.74$.

* * * * *